US008851886B2

(12) United States Patent  
Morita et al.

(10) Patent No.: US 8,851,886 B2  
(45) Date of Patent: Oct. 7, 2014

(54) SUBSTRATE PROCESSING APPARATUS AND METHOD OF MANUFACTURING SEMICONDUCTOR DEVICE

(75) Inventors: Shinya Morita, Toyama (JP); Akihiro Sato, Toyama (JP); Akinori Tanaka, Toyama (JP); Shigeo Nakada, Toyama (JP); Takayuki Nakada, Toyama (JP); Shuhei Saido, Toyama (JP); Tomoyuki Matsuda, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 1193 days.

(21) Appl. No.: 12/363,059

(22) Filed: Jan. 30, 2009

(65) Prior Publication Data

US 2009/0197409 A1   Aug. 6, 2009

(30) Foreign Application Priority Data

Feb. 1, 2008   (JP) ................. 2008-022541

(51) Int. Cl.  
*F27D 1/18* (2006.01)  
*C23C 16/44* (2006.01)  
*C23C 16/455* (2006.01)  
*H01L 21/67* (2006.01)

(52) U.S. Cl.  
CPC ...... *H01L 21/67109* (2013.01); *C23C 16/4401* (2013.01); *C23C 16/455* (2013.01); *H01L 21/67098* (2013.01)  
USPC ........................ 432/242; 432/247; 118/724

(58) Field of Classification Search  
USPC ............. 432/239, 241, 247, 242, 244, 245, 5; 219/390; 118/724, 729; 438/715, 678, 438/680  
See application file for complete search history.

(56) References Cited

U.S. PATENT DOCUMENTS

| 5,507,639 | A  | * | 4/1996  | Monoe ........................... 432/77 |
| 5,578,132 | A  | * | 11/1996 | Yamaga et al. ............... 118/724 |
| 5,662,470 | A  | * | 9/1997  | Huussen et al. .............. 432/241 |
| 5,718,574 | A  | * | 2/1998  | Shimazu ...................... 432/253 |
| 5,904,478 | A  | * | 5/1999  | Weaver et al. ............... 432/241 |
| 6,235,121 | B1 | * | 5/2001  | Honma et al. ................ 118/730 |
| 6,736,636 | B2 | * | 5/2004  | Saito ............................ 432/239 |
| 7,575,370 | B2 | * | 8/2009  | Park et al. ....................... 374/1 |
| 8,057,599 | B2 | * | 11/2011 | Ozaki et al. .................. 118/715 |
| 2002/0168854 | A1 |   | 11/2002 | Tometsuka |

(Continued)

FOREIGN PATENT DOCUMENTS

| JP | 07-78780  | 3/1995 |
| JP | 11-111632 | 4/1999 |

(Continued)

*Primary Examiner* — Gregory A Wilson  
(74) *Attorney, Agent, or Firm* — Brundidge & Stanger, P.C.

(57) ABSTRACT

Provided is a substrate processing apparatus. The substrate processing apparatus includes a reaction tube; a heating device configured to heat the reaction tube; and a manifold installed outward as compared with the heating device and made of a non-metallic material. A first thickness of the manifold defined in a direction perpendicular to a center axis of the reaction tube is greater than a second thickness of the manifold defined at a position adjacent to the reaction tube in a direction parallel to the center axis of the reaction tube. The manifold includes a protrusion part of which at least a portion protrudes inward more than an inner wall of the reaction tube, and a gas supply unit disposed at at least the protrusion part for supplying gas to an inside of the reaction tube.

19 Claims, 6 Drawing Sheets

(56) References Cited

U.S. PATENT DOCUMENTS

2003/0175650 A1 9/2003 Ridder et al.
2003/0221623 A1* 12/2003 Shima et al. .................. 118/724
2007/0075086 A1 4/2007 Honma et al.

FOREIGN PATENT DOCUMENTS

| JP | 2002-334868 | 11/2002 |
| JP | 2004-31915 | 1/2005 |
| JP | 2005-203720 | 7/2005 |

* cited by examiner

SUBSTRATE PROCESSING APPARATUS AND METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application No. 2008-022541, filed on Feb. 1, 2008, in the Japanese Patent Office, the entire contents of which are hereby incorporated by reference.

BACKGROUND OF THE INVENTION

1. Field of the Invention

The present invention relates to a substrate processing apparatus and a method of manufacturing a semiconductor device.

For example, the present invention may be effectively applied to a thermal treatment apparatus (furnace) configured to perform a thermal treatment process such as a film forming, annealing, oxidation, diffusion, or reflow process to form an oxide layer, a metal layer, or a semiconductor layer on a semiconductor wafer (hereinafter, referred to as a wafer) for forming a semiconductor integrated circuit device (hereinafter, referred to as an IC).

2. Description of the Prior Art

In a method of manufacturing an IC, a thermal treatment apparatus such as a batch type vertical hot-wall chemical vapor deposition (CVD) apparatus is widely used to deposit a material such as silicon nitride ($Si_3N_4$), silicon oxide ($SiO_x$), and polysilicon on a wafer.

The batch type vertical hot-wall CVD apparatus (hereinafter, referred to a CVD apparatus) includes: an outer tube; an inner tube installed inside the outer tube to form a process chamber; a heating device (heater) configured to heat the inside of the outer tube; a manifold on which the outer and inner tubes are placed and to which an exhaust pipe and a gas introducing pipe are connected for exhausting the process chamber and supplying gas to the process chamber; and a boat configured to hold a plurality of vertically arranged wafers and be loaded into the process chamber.

When the boat in which a plurality of wafers are held is loaded into the process chamber through a lower furnace throat, a film-forming gas is supplied to the process chamber through the gas introducing pipe, and at the same time, the process chamber is heated by the heating device, so that CVD layers can be deposited on the wafers.

Such a conventional CVD apparatus, for example, a CVD apparatus disclosed in Patent Document 1, includes a manifold (furnace throat flange) made of a metal.

Since the metallic manifold has a thin plate thickness and low heat capacity, heat can be easily dissipated to the outside of a furnace throat.

[Patent Document 1] Japanese Unexamined Patent Application Publication No. 2002-334868

However, such a CVD apparatus including a metallic manifold has a problem in that the metallic manifold is corroded by reaction products, which are generated from reaction gas and cleaning gas and attached to the metallic manifold.

Moreover, as the size of ICs reduces, metal emission from the metallic manifold of the CVD apparatus causes other problems.

SUMMARY OF THE INVENTION

An object of the present invention is to provide a substrate processing apparatus and a method of manufacturing a semiconductor device that are designed to prevent corrosion of a manifold and metallic contamination caused by the manifold.

According to an aspect of the present invention, there is provided a substrate processing apparatus including: a reaction tube including an outer tube and an inner tube disposed in the outer tube; and a ring-shaped manifold made of a non-metallic material, the ring-shaped manifold including: a supporting part supporting the outer tube; a protrusion part disposed interior to the supporting part and supporting the inner tube; and a gas supply unit disposed at the protrusion part, the gas supply unit configured to supply gas into the reaction tube, wherein a first length corresponding to a distance between outer and inner circumferential surfaces of the manifold is greater than a second length corresponding to a distance between too and bottom surfaces of the supporting part.

According to another aspect of the present invention, there is provided a substrate processing apparatus including: a reaction tube including an outer tube and an inner tube disposed in the outer tube; a ring-shaped manifold made of a non-metallic material, the ring-shaped manifold including: a supporting part supporting the reaction tube from thereunder; a protrusion part disposed interior to the supporting part; and a gas supply unit disposed at the protrusion part, the gas supply unit configured to supply gas into the reaction tube, wherein a first length corresponding to a distance between outer and inner circumferential surfaces of the manifold is greater than a second length corresponding to a thickness of the supporting part, wherein the protrusion part includes, in an inner wall thereof, a groove extending from the gas supply unit to a contacting surface between the protrusion part and the inner tube.

According to another aspect of the present invention, there is provided a method of manufacturing a semiconductor device performed in a substrate processing apparatus including: a reaction tube including an outer tube and an inner tube disposed in the outer tube; and a ring-shtalled manifold made of a non-metallic material, the ring-shaped manifold including a supporting part supporting the outer tube, a protrusion part disposed interior to the supporting part and supporting the inner tube and a gas supply unit disposed at the protrusion part, the gas supply unit configured to supply gas into the reaction tube, wherein a first length corresponding to distance between outer and inner circumferential surfaces of the manifold is greater than a second length corresponding to a distance between top and bottom surfaces of the supporting part, the method including: closing an opening of the manifold using a seal cap while loading a substrate into the reaction tube; processing the substrate by supplying the gas into the reaction tube through the gas supply unit while heating the inside of the reaction tube; and opening the seal cap while unloading the substrate from the reaction tube.

DETAILED DESCRIPTION OF THE PREFERRED EMBODIMENTS

Hereinafter, an embodiment of the present invention will be described with reference to the attached drawings.

In the current embodiment, a substrate processing apparatus of the present invention is configured by a CVD apparatus (batch type vertical hot-wall CVD apparatus) adapted to perform a film-forming operation in an IC manufacturing process.

Figure 1:
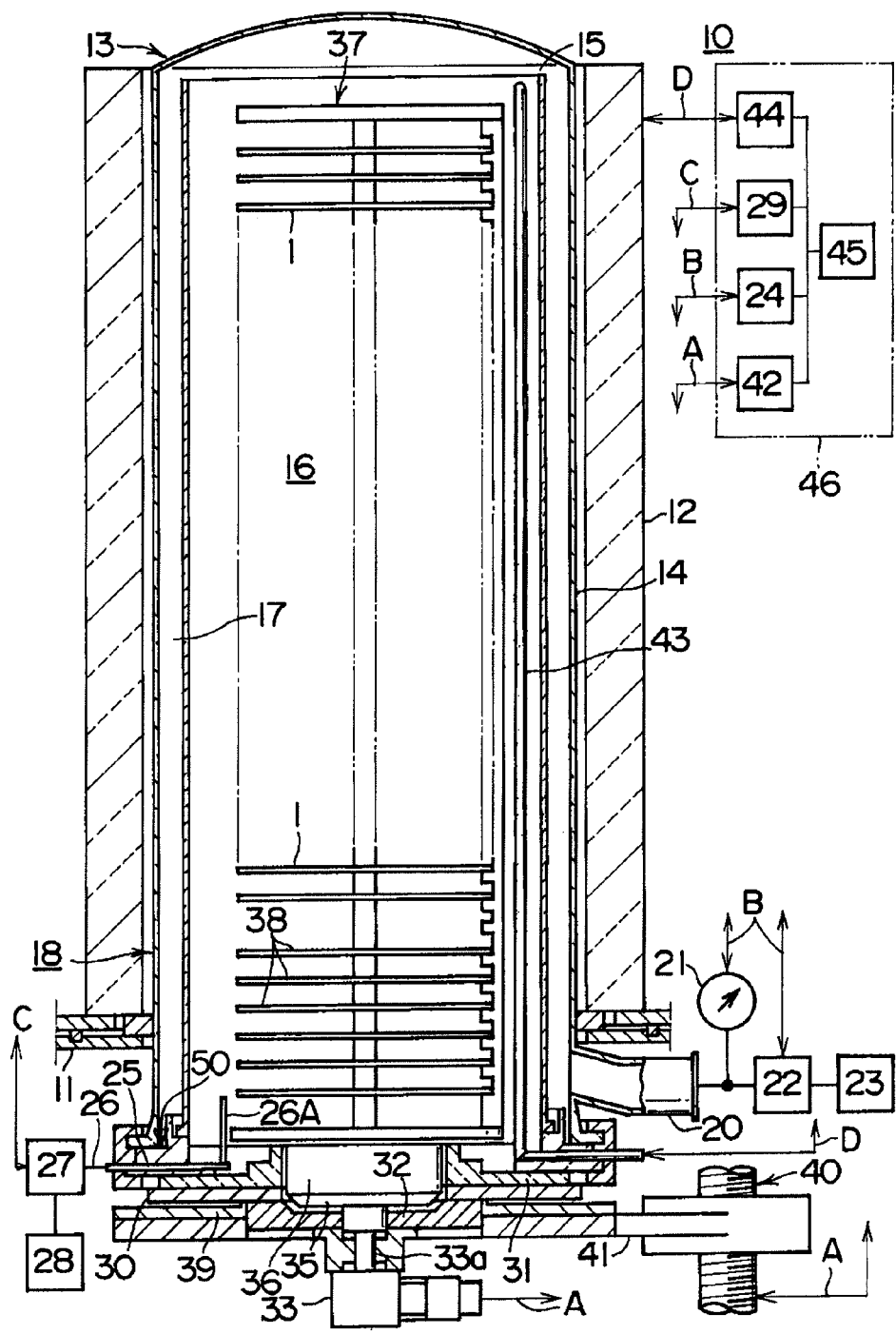
FIG. 1 is a vertical sectional view illustrating a chemical vapor deposition (CVD) apparatus in accordance with an embodiment of the present invention.

As shown in FIG. 1, a CVD apparatus 10 includes a heater 12 as a heating device.

The heater 12 has a cylindrical shape and is vertically installed in a manner that the heater 12 is supported on a heater base 11 used as a holding plate.

At the inside of the heater 12, a process tube 13 is installed coaxially with the heater 12 as a reaction tube. The process tube 13 includes an outer tube 14 used as an outer reaction tube and an inner tube 15 used as an inner reaction tube.

The outer tube 14 is made of a heat resistant material such as quartz ($SiO_2$) or silicon carbide (SiC) and has a cylindrical shape with an inner diameter greater than the outer diameter of the inner tube 15. The outer tube 14 has a closed top end and an opened bottom end.

The inner tube 15 is made of a heat resistant material such as quartz ($SiO_2$) or silicon carbide (SiC) and has a cylindrical shape with opened top and bottom ends. A hollow portion of the inner tube 15 forms a process chamber 16. The process chamber 16 is configured to accommodate a boat 37 (described later) in which wafers 1 are horizontally positioned and vertically arranged in multiple stages.

The outer tube 14 and the inner tube 15 are coaxially installed. A cylindrical space 17 is formed between the outer tube 14 and the inner tube 15.

At the lower side of the outer tube 14, a manifold 50 (described later) is installed coaxially with the outer tube 14. The outer tube 14 and the inner tube 15 are placed on the manifold 50. The process tube 13 and the manifold 50 constitute a process vessel 18.

The outer tube 14 is connected to an exhaust pipe 20, which is used to exhaust the inside atmosphere of the process tube 13. The exhaust pipe 20 is disposed at a lower end portion of the cylindrical space 17 and communicates with the cylindrical space 17.

To the downstream side of the exhaust pipe 20 opposite to the outer tube 14, an exhaust device 23 such as a vacuum pump is connected through a pressure sensor 21 used as a pressure detector and a pressure adjusting device 22. The exhaust device 23 exhausts the process chamber 16 to a predetermined pressure (vacuum degree).

A pressure control unit 24 is electrically connected to the pressure sensor 21 and the pressure adjusting device 22 through electric lines B. The pressure control unit 24 controls the pressure adjusting device 22 based on pressure information detected by the pressure sensor 21 so as to adjust the inside pressure of the process chamber 16 to a predetermined level at a desired time.

Figure 2:
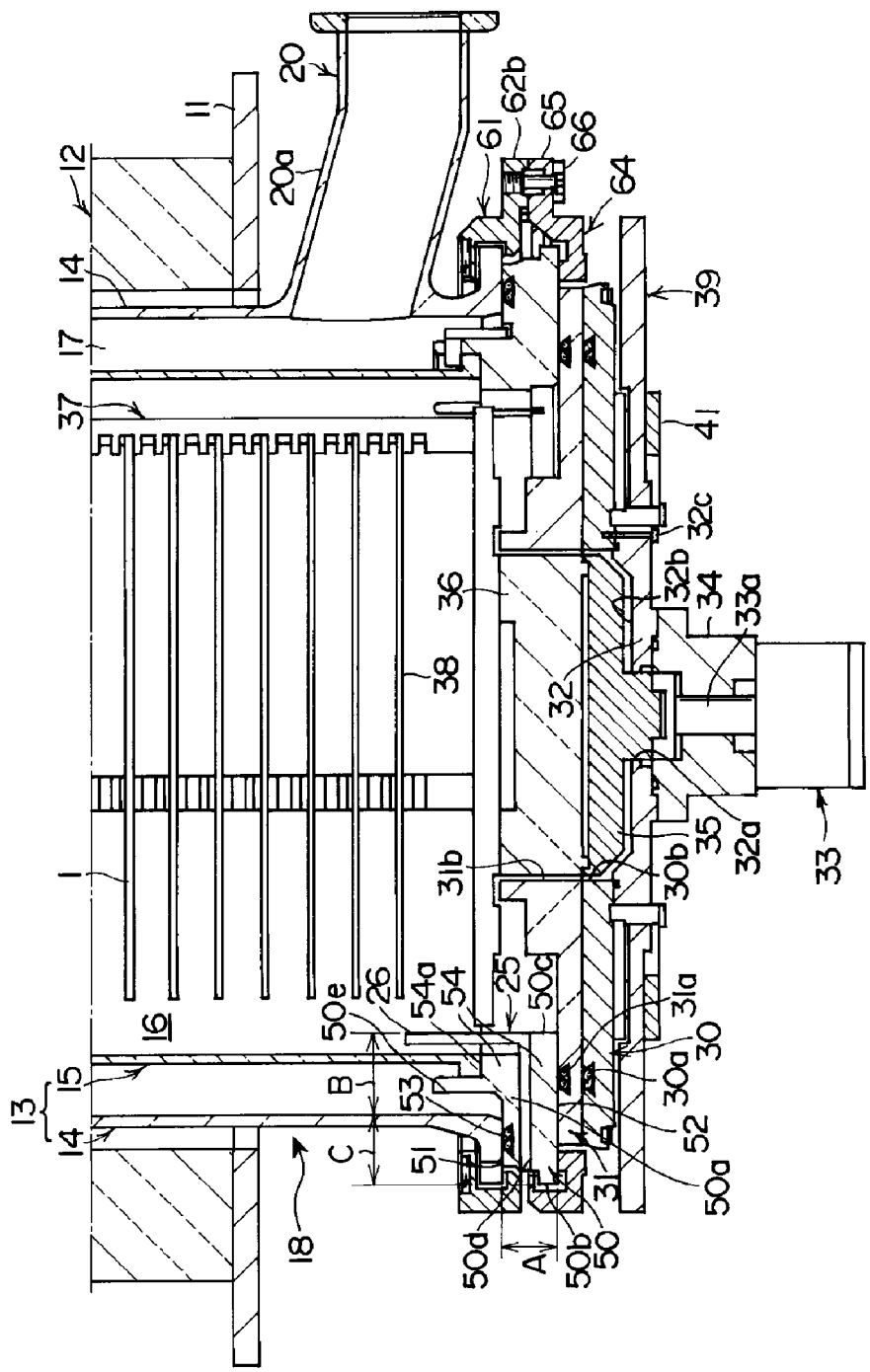
FIG. 2 is a vertical section view illustrating characteristic parts of the CVD apparatus.

The exhaust pipe 20 includes a slope part 20a (refer to FIG. 2). The slope part 20a is inclined from the heater base 11 to an outer tube receiving part 61 (refer to FIG. 2). Since the exhaust pipe 20 includes the slope part 20a, an area of the process vessel 18 excluding a heating area can have a small height.

On the contrary, if the area of the process vessel 18 excluding the heating area has a large height, the height of the boat 37 should be high to place wafers in the heating area formed by the heater 12. Moreover, if the height of the boat 37 is high, the height of a waiting chamber (preliminary chamber) located under the process vessel 18 should be accordingly high. Therefore, in the case where the area of the process vessel 18 excluding the heating area has a large height, the overall height of the CVD apparatus 10 is also increased by about two times the height of the area of the process vessel 18 excluding the heating area.

In the current embodiment, the height of the process vessel 18 excluding the heating area can be reduced owing to the slope part 20a of the exhaust pipe 20, and thus, the overall height of the CVD apparatus 10 can be reduced by about two times the reduced height.

A gas supply unit 25 is installed at the process vessel 18 and communicates with the process chamber 16. A gas supply pipe 26 is connected to the gas supply unit 25.

The upstream side of the gas supply pipe 26 opposite to the gas supply unit 25 is connected to a mass flow controller (MFC) 27 used as a gas flow rate controller, and the MFC 27 is connected to a gas supply source 28. The gas supply source 28 supplies process gas or inert gas.

A gas flow rate control unit 29 is electrically connected to the MFC 27 through an electric line C. The gas flow rate control unit 29 controls the MFC 27 such that a desired rate of gas can be supplied at a desired time.

At the lower side of the process vessel 18, a seal cap 30 is installed. The seal cap 30 constitutes a cover part for airtightly closing an opened bottom end of the process chamber 16. For example, the seal cap 30 is made of a metallic material such as stainless steel or nickel alloy and has a disk shape.

At the side of the seal cap 30 facing the process chamber 16, a seal cap cover 31 is installed. For example, the seal cap cover 31 is made of a non-metallic material such as quartz. The seal cap cover 31 covers the seal cap 30 so that the metallic seal cap 30 is not exposed to the process chamber 16.

The seal cap cover 31 is configured to be brought into contact with the bottom surface of the process vessel 18 in a vertical direction from the downside.

As shown in FIG. 2, at the top surface of the seal cap 30, an O-ring 30a is installed. The O-ring 30a makes contact with the bottom surface of the seal cap cover 31 as a seal member.

At the top surface of the seal cap cover 31, another O-ring 31a is installed. The O-ring 31a makes contact with the bottom surface of the process vessel 18 as a seal member.

At the center part of the seal cap 30, a circular hole 30b is formed, and at the center part of the seal cap cover 31, another circular hole 31b is formed. The circular hole 30b of the seal cap 30 and the circular hole 31b of the seal cap cover 31 are overlapped with each other.

At the (bottom) side of the seal cap 30 opposite to the seal cap cover 31, a flange 32 is installed. The flange 32 has an outer diameter larger than the diameter of the circular hole 30b. The flange 32 is fixed to the bottom side of the seal cap 30 using an attaching screw 32c. At the center part of the flange 32, an insertion hole 32a is formed. At the top surface of the flange 32, a recess 32b is formed concentric to the insertion hole 32a. The recess 32b has a diameter greater than the diameter of the insertion hole 32a but smaller than the diameter of the circular hole 30b of the seal cap 30 and the diameter of the circular hole 31b of the seal cap cover 31.

At the bottom center part of the flange 32, a rotation mechanism 33 is installed via a bearing 34. At the upper end of a rotation shaft 33a of the rotation mechanism 33, a boat receiving part 35 is installed in a manner that the boat receiving part 35 is rotatable together with the rotation shaft 33a. For example, the boat receiving part 35 is made of a metal such as stainless or nickel alloy and has a two-step cylinder shape with a relatively large diameter at an upper part and a small diameter at a lower part. The boat receiving part 35 is inserted at an interior region defined by the insertion hole 32a of the flange 32, the recess 32b of the flange 32, and the circular hole 30b of the seal cap 30.

A pedestal 36 is placed on the boat receiving part 35 in a manner that the pedestal 36 can be rotated together with the boat receiving part 35 and the rotation shaft 33a. The pedestal 36 is made of a material such as alumina ceramic, transparent quartz, or opaque quartz and has a cylindrical shape. The pedestal 36 is rotatably inserted in the circular hole 31b of the seal cap cover 31. The boat 37 is placed above the pedestal 36 in a manner that the boat 37 can be rotated together with the pedestal 36, the boat receiving part 35, and the rotation shaft 33a.

The boat 37 is used as a substrate holder and is made of a heat resistant material such as quartz or silicon carbide. The boat 37 is configured to hold a plurality of wafers 1 in a manner that the wafers 1 are horizontally positioned and arranged in multiple stages with centers of the wafers 1 being aligned.

At the lower part of the boat 37, a plurality of insulating plates 38 are horizontally disposed in multiple stages as insulating members. For example, the insulating plates 38 are made of a heat resistant material such as quartz or silicon carbide and have a disk shape. The insulating plates 38 suppress heat transfer from the heater 12 to the seal cap 30.

In the current embodiment, the diameter of the circular hole 30b of the seal cap 30 and the diameter of the circular hole 31b of the seal cap cover 31 are greater than the outer diameters of the boat receiving part 35 and the pedestal 36 so that the boat receiving part 35 and the pedestal 36 can be inserted into the circular hole 31b of the seal cap cover 31 and the circular hole 30b of the seal cap 30 from the top side of the circular holes 31b and 30b.

Furthermore, the boat receiving part 35, the pedestal 36, the flange 32, the bearing 34, the rotation shaft 33a, and the rotation mechanism 33 can be installed and detached through the bottom side of the seal cap 30 in a state where the seal cap 30 closes a furnace throat of the process vessel 18.

Therefore, in a state where the rotation mechanism 33, the bearing 34, the boat receiving part 35, and the pedestal 36 are installed at the flange 32, the seal cap cover 31 can be detached from the seal cap 30 or installed to the seal cap 30.

That is, maintenance works for the parts such as the seal cap 30, the seal cap cover 31, the flange 32, the pedestal 36, the boat receiving part 35, the rotation shaft 33a, the bearing 34, and the rotation mechanism 33 can be performed more efficiently.

In addition, since maintenance works to be performed at the process chamber 16 through the seal cap 30 can be reduced, contamination of the process chamber 16 caused by dust generated from the human body itself and generated when a screw is rotated can be decreased.

Since the boat receiving part 35 is inserted in the interior region defined by the insertion hole 32a of the flange 32, the recess 32b of the flange 32, and the circular hole 30b of the seal cap 30, the position of the boat receiving part 35 is lower than the seal cap cover 31. Therefore, heat radiation from the process tube 13 to the boat receiving part 35 through the seal cap cover 31 and the pedestal 36 can be reduced, and the boat receiving part 35 can be prevented from being directly exposed to process gas or cleaning gas of the process chamber 16. Accordingly, the boat receiving part 35 made of a metallic material can be prevented from being excessively heated and exposed to corrosive gas. As a result, metallic contamination caused by the metallic boat receiving part 35 can be reduced.

Furthermore, it is preferable that the top surface of the boat receiving part 35 be lower than the bottom surface of the seal cap cover 31, and at least, the top surface of the boat receiving part 35 is lower than the top surface of the seal cap cover 31.

In addition, inert gas can be supplied to a gap between the boat receiving part 35 and the circular holes 30b and 31b of the seal cap 30 and the seal cap cover 31 so as to prevent the inside atmosphere of the process vessel 18 from making contact with the boat receiving part 35, the flange 32, the rotation shaft 33a, and the bearing 34.

Since the pedestal 36 is made of alumina ceramic, transparent quartz, or opaque quartz, although the pedestal 36 disposed inside the seal cap cover 31 is exposed to the inside of the process chamber 16, the inside of the process chamber 16 is not metallically contaminated by the pedestal 36.

Furthermore, it is preferable that the pedestal 36 be made of alumina ceramic.

Since the mechanical strength of alumina ceramic is greater than that of quartz, breakage or splitting of the boat 37 or the pedestal 36 can be prevented when the boat 37 is placed on the pedestal 36.

As shown in FIG. 1, a base 39 is vertically supported by an arm 41 of a boat elevator 40.

The boat elevator 40 is vertically installed outside the process tube 13. The boat elevator 40 is an elevating mechanism configured to move the boat 37 upward and downward in a vertical direction. That is, the boat elevator 40 is used to load the boat 37 into the process chamber 16 and unload the boat 37 from the process chamber 16.

A driving control unit 42 is electrically connected to the rotation mechanism 33 and the boat elevator 40 through electric lines A. The driving control unit 42 controls the rotation mechanism 33 and the boat elevator 40 so that desired operations of the rotation mechanism 33 and the boat elevator 40 can be performed at desired times.

At the inside of the process tube 13, a temperature sensor 43 is installed as a temperature detector.

A temperature control unit 44 is electrically connected to the heater 12 and the temperature sensor 43 through electric lines D. The temperature control unit 44 controls power supplied to the heater 12 based on temperature information detected by the temperature sensor 43 so that desired temperature distribution can be obtained at the inside of the process chamber 16 at a desired time.

The pressure control unit 24, the gas flow rate control unit 29, the driving control unit 42, and the temperature control unit 44 constitute a manipulation part and an input/output part, and are electrically connected to a main control unit 45 that controls the overall operation of the CVD apparatus 10.

A controller 46 is configured by the pressure control unit 24, the gas flow rate control unit 29, the driving control unit 42, the temperature control unit 44, and the main control unit 45.

Figure 3:
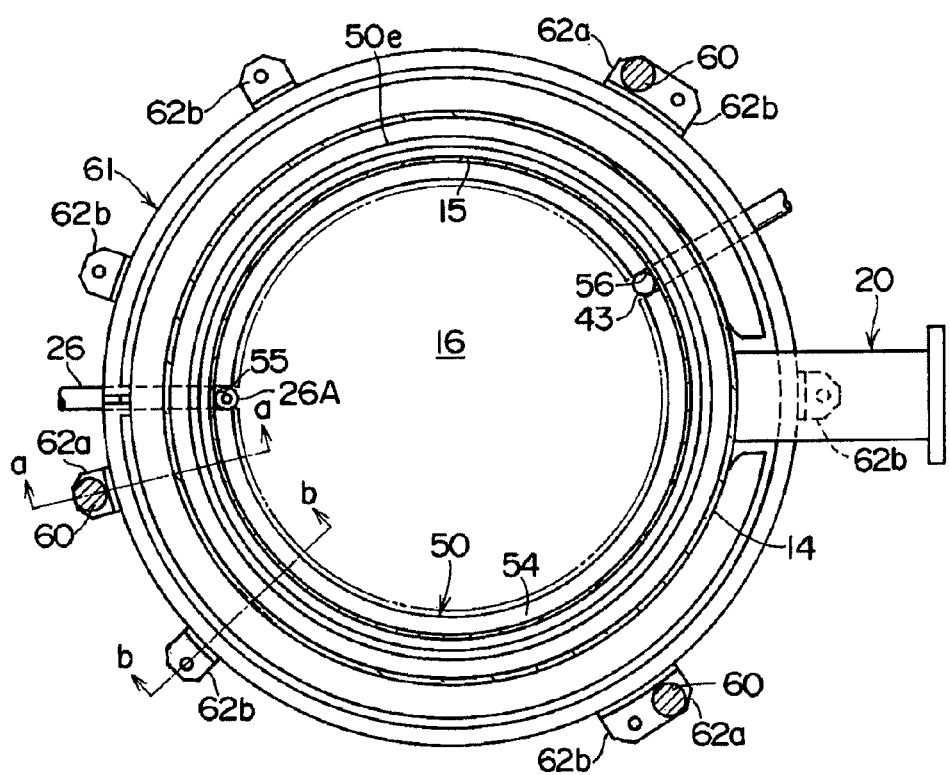
FIG. 3 is a horizontal sectional view illustrating the CVD apparatus.

The manifold 50 is made of a non-metallic material such as quartz and has a circular-ring, flat-block shape (refer to FIG. 3). The manifold 50 is transparent or semitransparent. The manifold 50 includes a protrusion part 50a that protrudes inward more than the inner circumferential surface of the outer tube 14. In addition, as shown in FIG. 2, the gas supply unit 25 is formed at the manifold 50 by a penetration hole 50d formed from an outer wall 50b to an inner wall 50c of the protrusion part 50a, and a nozzle 26A (refer to FIG. 1 or FIG. 3) inserted through the penetration hole 50d.

As explained above, since the manifold 50 is made of a non-metallic material such as quartz, the manifold 50 does not produce corrosive metallic contaminants even when gas corrosive to a metal part is supplied to the inside of the process vessel 18 or the inside of the process vessel 18 is dry-cleaned with etching gas.

The manifold 50 has a circular-ring and flat-block shape, and particularly, the manifold 50 includes the protrusion part 50a so that the manifold 50 can have a large area for receiving heat rays directly from the heater 12. Therefore, the manifold 50 can receive radiant heat easily, and heat can be easily transferred across the manifold 50 because the manifold 50 has a low thermal capacity owing to its thin thickness.

Therefore, byproducts are not easily adhered to the surface of the manifold 50.

In addition, gas such as gas supplied through the gas supply unit 25 is preheated at the manifold 50.

As shown in FIG. 2, the manifold 50 has a width B larger than a height A. That is, width B>height A. The height A is a thickness of the manifold 50 defined at a position adjacent to at least the outer tube 14 in a direction parallel to the center axis of the reaction tube. That is, the height A is a length between a first contact surface 51 with the outer tube 14 and a second contact surface 52 with the seal cap cover 31. The width B is a length defined from the inner circumferential surface of the outer tube 14 to the inner circumferential surface of the manifold 50 in a direction perpendicular to the center axis of the process vessel 18.

Since the manifold 50 is configured as described above, the height A of the manifold 50 can be small.

If the height A of the manifold 50 is large, wafers 1 cannot be placed in a heating area formed by the heater 12 unless the height of the boat 37 is accordingly high. Moreover, the height of the waiting chamber for the boat 37 should be high.

Therefore, in the case where the height A of the manifold 50 is increased, the overall height of the CVD apparatus 10 is increased by about two times the increased amount of the height A.

In other words, by reducing the height A of the manifold 50 according to the current embodiment, the overall height of the CVD apparatus 10 can be reduced by about two time the reduced height of the manifold 50.

As shown in FIG. 2, the manifold 50 is configured such that the width B (defined from the inner circumferential surface of the outer tube 14 to the inner circumferential surface of the manifold 50) is greater than a distance C defined from the outer circumferential surface of the manifold 50 to the inner circumferential surface of the outer tube 14. That is, width B>distance C.

Since the manifold 50 is configured as described above, the manifold 50 can have a compact shape with a relatively large surface for receiving heat rays directly from the heater 12.

In addition, on the first contact surface 51 of the manifold 50, an O-ring 53 is installed. The O-ring 53 is a seal member making contact with the bottom surface of the outer tube 14.

As shown in FIG. 2 and FIG. 3, at the protrusion part 50a of the manifold 50, the height A and the width B of the manifold 50 are extended to the bottom surface of the inner tube 15 so that the protrusion part 50a forms a supporting part 54. The supporting part 54 includes a placement surface 54a for supporting the inner tube 15 from the downside of the inner tube 15. The supporting part 54 forms the thickness of the flat-block shaped manifold 50. That is, the bottom end of the supporting part 54 extends to the second contact surface 52 with the seal cap cover 31. Therefore, the supporting part 54 can have sufficient strength for supporting the weight of the inner tube 15.

In addition, the supporting part 54 fills a dead space formed under the gas supply unit 25. That is, the flat-block shaped manifold 50 fills the dead space formed under the gas supply unit 25. In other words, since the seal cap cover 31 and the supporting part 54 are close, an upstream gas flow to the wafer 1 can have a small stagnant zone.

Since byproducts can be readily produced at a stagnant zone of a gas flow, if a stagnant zone is formed in a gas flow to the wafer 1, the byproducts can easily flow along the gas flow and stick to the wafer 1 as particles.

According to the current embodiment, generation of a stagnant zone in an upstream gas flow to the wafer 1 can be suppressed, and thus particles are difficult to stick to the wafer 1.

Since the supporting part 54 of the manifold 50 supports the inner tube 15, the manifold 50 and the inner tube 15 can be detached together.

As shown in FIG. 2 and FIG. 3, the width B of the manifold 50 protrudes inward more than the inner circumferential surface of the inner tube 15, and a gas supply groove 55 is formed in an inner surface of the protrusion part 50a in a direction perpendicular to the gas supply unit 25. The gas supply groove 55 faces the gas supply unit 25 and has a depth equal to or greater than the radius of a vertically extending part of a nozzle 26A connected to a leading end of the gas supply pipe 26.

The gas supply pipe 26 is inserted in the gas supply unit 25, and the nozzle 26A is connected to the leading end of the gas supply pipe 26 in a manner that the nozzle 26A extends vertically from the leading end of the gas supply pipe 26.

The nozzle 26A is inserted in the gas supply groove 55, and the position of the nozzle 26A is determined by the gas supply groove 55. In other words, the gas supply groove 55 prevents misalignments of the gas supply pipe 26 and the nozzle 26A in circumferential and downward directions and properly positions the gas supply pipe 26 and the nozzle 26A.

Since the gas supply groove 55 determines the installation directions of the gas supply pipe 26 and the nozzle 26A, the installation repeatability of the gas supply pipe 26 and nozzle 26A may be improved owing to the gas supply groove 55.

Since the gas supply groove 55 determines the positions of the gas supply pipe 26 and the nozzle 26A, an additional dedicated part composed of a metal member may be not necessary for preventing misalignments of the gas supply pipe 26 and the nozzle 26A.

In addition, since a dead space formed under the gas supply unit 25 can be reduced by inserting the gas supply pipe 26 in the gas supply groove 55, a gas stagnant zone of an upstream gas flow to the wafer 1 can be further reduced.

Furthermore, it is preferable that the gas supply groove 55 have a depth equal to or greater than the diameter of the vertically extending part of the nozzle 26A as indicated by imaginary lines in FIG. 3. In this case, the nozzle 26A can be positioned more stably, the installation repeatability of the nozzle 26A can be improved, and generation of a stagnant zone can be further suppressed.

As shown in FIGS. 2 and 3, a vertically extending temperature sensor groove 56 is formed in the manifold 50 at the inner circumferential surface of the protrusion part 50a away from the gas supply groove 55. The temperature sensor groove 56 faces the temperature sensor 43 and has a depth equal to or greater than the radius of a vertically extending part of the temperature sensor 43.

The vertically extending part of the temperature sensor 43 is inserted in the temperature sensor groove 56, and the position of the temperature sensor 43 is determined by the temperature sensor groove 56. In other words, the temperature sensor groove 56 prevents misalignments of the temperature sensor 43 in circumferential and downward directions and properly positions the temperature sensor 43.

Since the temperature sensor groove 56 determines the installation direction of the temperature sensor 43, the installation repeatability of the temperature sensor 43 may be improved owing to the temperature sensor groove 56.

Since the temperature sensor groove 56 determines the position of the temperature sensor 43, an additional dedicated part composed of a metal member may be not necessary for preventing misalignment of the temperature sensor 43.

In addition, since a dead space formed under the gas supply unit 25 can be reduced by inserting the temperature sensor 43 in the temperature sensor groove 56, a gas stagnant zone of an upstream gas flow to the wafer 1 can be further reduced.

Furthermore, it is preferable that the temperature sensor groove 56 have a depth equal to or greater than the diameter of the vertically extending part of the temperature sensor 43 as indicated by imaginary lines in FIG. 3. In this case, the temperature sensor 43 can be positioned more stably, the installation repeatability of the temperature sensor 43 can be improved, and generation of a stagnant zone can be further suppressed.

As shown in FIG. 2 and FIG. 3, an upper protrusion 50e is formed along the entire circumference of the manifold 50 as a fitting part for restricting the horizontal position of the inner tube 15 on the top surface of the manifold 50.

Alternatively, a plurality of upper protrusions 50e may be formed along the circumferential direction of the manifold 50 at predetermined intervals, preferably, regular intervals.

Figure 4A:
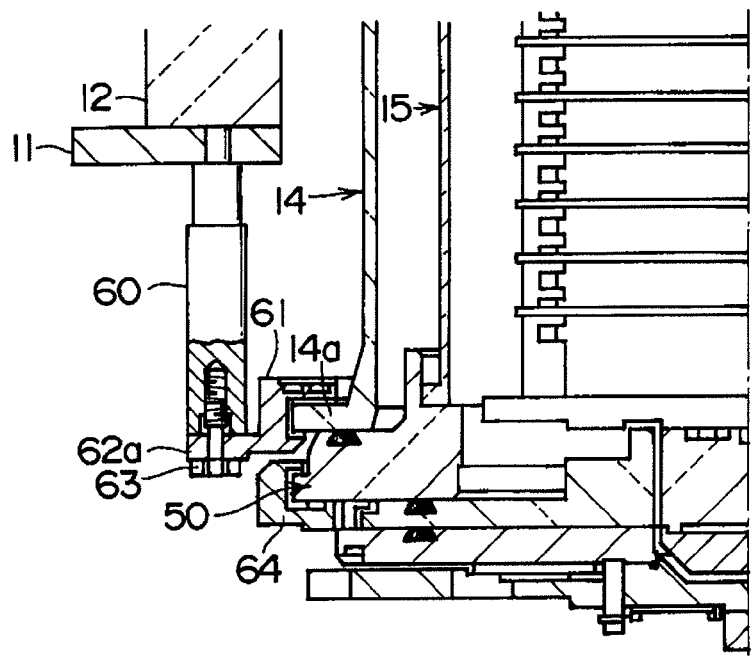
FIGS. 4A and 4B are sectional views taken along lines a-a and b-b of FIG. 3, respectively.

As shown in FIG. 3, at the outside of the outer tube 14, vertically extending three posts 60 are arranged in a circumferential direction at predetermined intervals, preferably, regular intervals. As shown in FIG. 4A, upper ends of the post 60 are fixed to the heater base 11.

The outer tube receiving part (first supporting member) 61 is suspended by the three posts 60. In detail, three brackets 62a are protruded along the outer circumference of the outer tube receiving part 61 at predetermined intervals, preferably, regular intervals, and the three brackets 62a are coupled to bottom surfaces of the three posts 60 by using bolts (coupling members) 63.

The outer tube receiving part 61 has a ring shape corresponding to a flange part 14a formed at the lower end of the outer tube 14. The outer tube receiving part 61 is mounted on the outer circumference of the flange part 14a. Therefore, the outer tube receiving part 61 can support the outer tube 14.

As shown in FIG. 3, in addition to the brackets 62a (hereinafter, referred to as first brackets) formed for the posts 60, six brackets 62b (hereinafter, referred to as second brackets) are protruded and arranged along the outer circumference of the outer tube receiving part 61 at predetermined intervals, preferably, regular intervals.

Figure 4B:
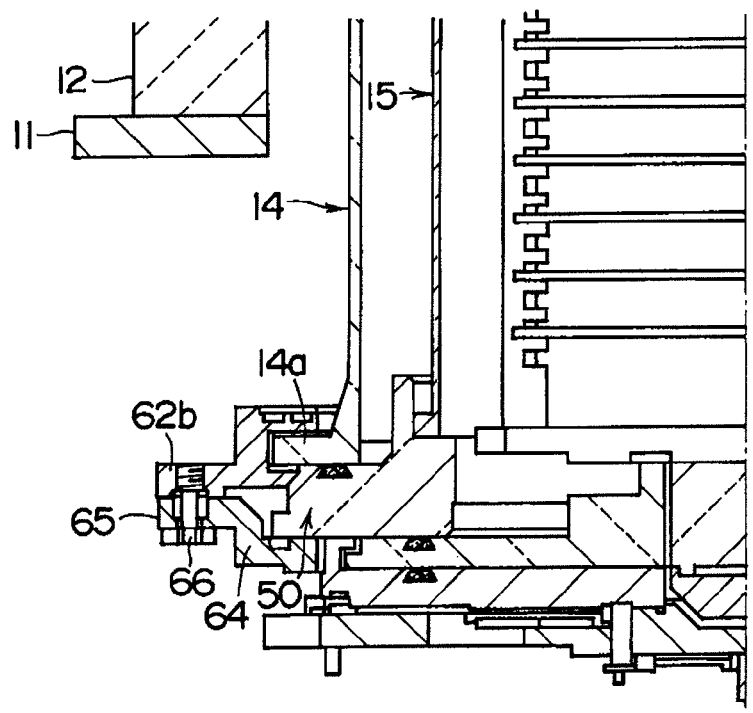

As shown in FIG. 4B, a manifold receiving part (second supporting member) 64 is suspended by the second six brackets 62b. In detail, six brackets 65 are protruded along the outer circumference of the manifold receiving part 64 at predetermined intervals, preferably, regular intervals, and the six brackets 65 are coupled to bottom surfaces of the second six brackets 62b by using bolts (coupling members) 66.

The manifold receiving part 64 has a ring shape corresponding to the shape of the manifold 50. The manifold receiving part 64 is mounted on the outer circumference of the manifold 50. Therefore, the manifold 50 can be supported by the manifold receiving part 64. The inner tube 15 is supported by the manifold 50 so that the inner tube 15 is also supported by the manifold receiving part 64.

The posts 60 fixed to the heater base 11 are used to support both the outer tube receiving part 61 and the manifold receiving part 64 so that the CVD apparatus 10 can have a compact structure.

After separating the outer tube receiving part 61 from the posts 61, the outer tube 14, the manifold 50, and the inner tube 15 can be detached together. Therefore, the outer tube 14, the manifold 50, and the inner tube 15 can be easily replaced.

In addition, it is preferable that the outer tube receiving part 61 and the manifold receiving part 64 be supported at a plurality of positions arranged at regular intervals along a circumferential direction so as to uniformly distribute and support the weights of the outer tube 14, the manifold 50, and the inner tube 15. Thus, the O-rings 30a, 31a, and 53 can provide reliable sealing.

Next, in an IC manufacturing method, a film-forming process using the above-described CVD apparatus 10 will be explained in accordance with an embodiment of the present invention.

In the following description, each part of the CVD apparatus 10 is controlled by the controller 46.

After a plurality of wafers 1 are charged in the boat 37, the boat 37 is lifted and loaded into the process chamber 16 by the boat elevator 40 as shown in FIG. 1.

In this state, the seal cap 30 seals the bottom of the manifold 50 via the O-ring 30a, the seal cap cover 31, and the O-ring 31a.

The inside of the process chamber 16 is exhausted to a desired pressure (vacuum degree) by the exhaust device 23. At this time, the pressure inside the process chamber 16 is measured using the pressure sensor 21, and the pressure adjusting device 22 is feedback-controlled based on the measured pressure.

In addition, the heater 12 is operated to heat the inside of the process chamber 16 to a desired temperature. At this time, to obtain desired temperature distribution inside the process chamber 16, power to the heater 12 is feedback-controlled based on temperature information detected by the temperature sensor 43.

Next, the rotation mechanism 33 rotates the boat 37 to rotate the wafers 1 charged in the boat 37.

Gas supplied from the gas supply source 28 is controlled to a desired flow rate by the MFC 27 and is directed to the gas supply pipe 26 where the gas is introduced into the process chamber 16 through the gas supply unit 25.

The introduced gas flows upward inside the process chamber 16 and is discharged through the opened top of the inner tube 15 to the cylindrical space 17 where the gas is exhausted through the exhaust pipe 20.

When the gas passes through the inside of the process chamber 16, the gas makes contact with surfaces of the wafers 1 so that thin films can be deposited on the surfaces of the wafers 1 by thermal CVD reaction.

After a predetermined process time, inert gas is supplied from the gas supply source 28 to replace the inside atmosphere of the process chamber 16 with inert gas and return the pressure inside the process chamber 16 to atmospheric pressure.

Thereafter, the boat elevator 40 moves the seal cap 30 downward to open the bottom of the process chamber 16 and unload the boat 37 charged with the processed wafers 1 from the process chamber 16.

Then, the processed wafers 1 are discharged from the boat 37.

Figure 5:
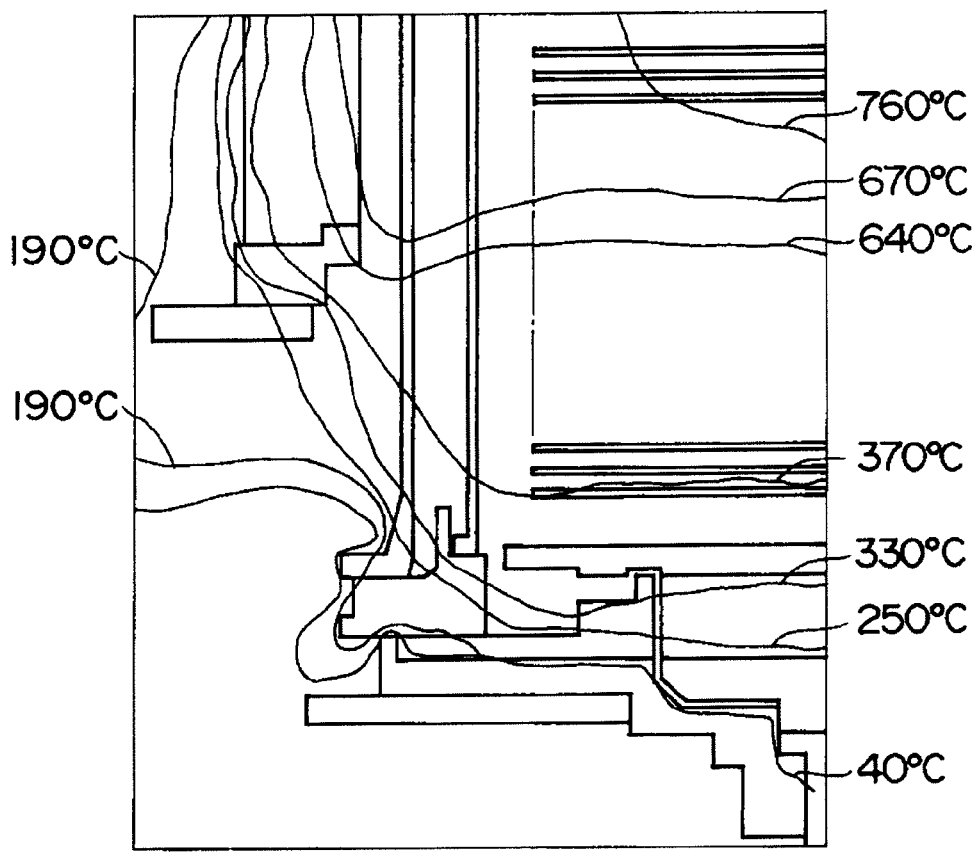
FIG. 5 is a view illustrating temperature distribution in the vicinity of a boat receiving part during a film-forming process.

FIG. 5 is a view illustrating temperature distribution in the vicinity of the boat receiving part during a film-forming process.

Referring to FIG. 5, it can be understood that the temperature of the boat receiving part 35 made of a metallic material is kept below 300° C. by disposing the boat receiving part 35 below the seal cap 30.

Thus, metallic contamination caused by the metallic boat receiving part 35 can be reduced.

Furthermore, referring to FIG. 5, it can be found that the manifold 50 is heated.

Since the manifold 50 is heated, adhering of byproducts to the manifold 50 can be prevented, and gas flowing through the gas supply unit 25 can be preheated.

For example, when a $Si_3N_4$ film is formed on a wafer, ammonia ($NH_3$) gas and dichlorosilane ($SiH_2Cl_2$) gas are supplied and allowed to flow through the process chamber, and the process chamber is maintained at 50 pa to 200 pa and 700° C. to 800° C. In this process, ammonium chloride ($NH_4Cl$) is generated as a byproduct. Solidification and adhesion of the ammonium chloride occur at about 150° C. However, referring to FIG. 5, the side of the manifold 50 facing the process chamber is kept equal to or higher than 190° C. Therefore, adhering of ammonium chloride can be prevented.

Figure 6:
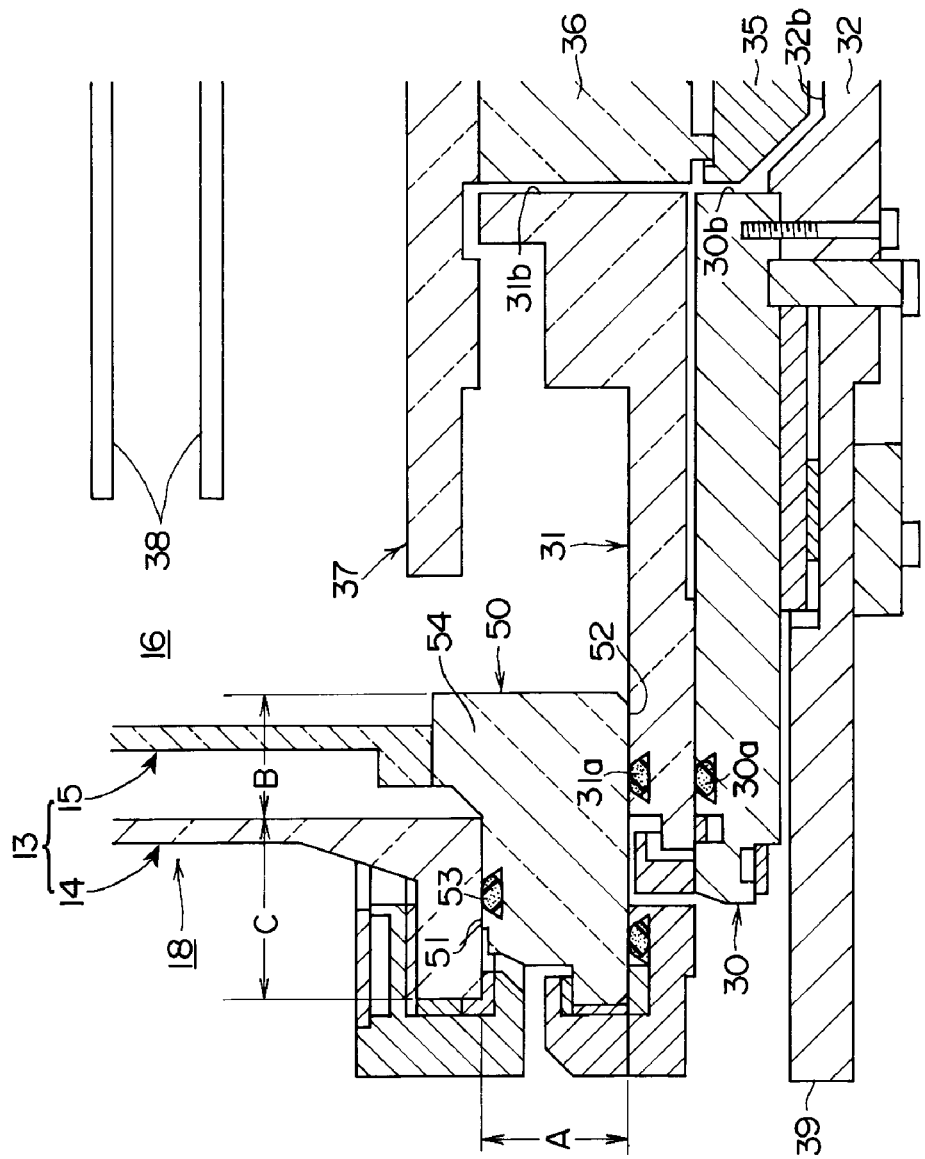
FIG. 6 is a vertical sectional view illustrating characteristic parts of a CVD apparatus in accordance with a second embodiment of the present invention.

FIG. 6 is a vertical sectional view illustrating characteristic parts of a CVD apparatus in accordance with a second embodiment of the present invention.

The current embodiment is different from the previous embodiment in that a height A between a first contact surface 51 and a second contact surface 52 is greater than a distance B between the inner circumferential surface of an outer tube 14 and the inner circumferential surface of a manifold 50 but the height A is smaller than the sum of the distance B and a distance C defined between the outer circumferential surface of the manifold 50 and the inner circumferential surface of the outer tube 14.

That is, A, B, and C satisfy the following formulas (1) and (2).

$$A > B \quad (1)$$

$$A < B + C \quad (2)$$

In the current embodiment, since the inner circumferential surface of the manifold 50 is located more outward than in the previous embodiment, it is slightly disadvantageous in that the manifold 50 is somewhat difficult to receive heat; however, adhering of byproducts can be prevented.

Furthermore, in the case where the thermal durability of an O-ring 53 is insufficient, the number of insulating plates 38 can be adjusted to absorb more heat and reduce heat transfer to the O-ring 53. However, in this case, the number of wafers processed at one time (that is, the number of wafers charged in a boat at one time) can be reduced. Thus, it is effective that the O-ring 53 is placed more outward (B<C).

The present invention is not limited to the above-described embodiments, and various changes in form and details may be made in the embodiments without departing from the spirit and scope of the present invention.

For example, the material that can be used for making the manifold is not limited to quartz. That is, the manifold can be made of other materials such as alumina.

However, alumina can be readily cracked by temperature changes because the alumina is not resistant to a rapid temperature change. For example, a manifold made of alumina may be cracked when the temperature of a furnace varies from 700° C. by 100° C. or more. Therefore, it is preferable that the manifold be made of quartz.

For example, the slope part 20a may be not formed at the exhaust pipe 20 although the height of the process vessel 18 excluding the heating area cannot be reduced.

For example, the seal cap cover may be not used although it may be difficult to suppress metallic contamination from the seal cap.

In the above-described embodiments, a CVD apparatus is explained; however, the present invention is not limited to the CVD apparatus. That is, the present invention may be applied to various substrate processing apparatuses such as a thermal treatment apparatus configured to perform a thermal treatment process such as film forming, annealing, oxidation, diffusion, and reflow treatment processes.

Substrates that can be processed according to the present invention are not limited wafers. Examples of such substrates include a photomask or printed circuit substrate, a liquid crystal panel, an optical disk, and a magnetic disk.

According to the present invention, corrosion of the manifold and metallic contamination caused by the manifold can be prevented.

(Supplementary Note)

The present invention also includes the following preferable embodiments.

(Supplementary Note 1)

According to a preferred embodiment of the present invention, there is provided a substrate processing apparatus including: a reaction tube; a heating device configured to heat the reaction tube; and a manifold installed outward as compared with the heating device and made of a non-metallic material, wherein a first thickness of the manifold defined in a direction perpendicular to a center axis of the reaction tube is greater than a second thickness of the manifold defined at a position adjacent to the reaction tube in a direction parallel to the center axis of the reaction tube, and the manifold includes: a protrusion part of which at least a portion protrudes inward more than an inner wall of the reaction tube; and a gas supply unit disposed at at least the protrusion part for supplying gas to an inside of the reaction tube.

(Supplementary Note 2)

In the substrate processing apparatus of Supplementary Note 1, the reaction tube may include an outer tube and an inner tube, and the protrusion part of the manifold may form a supporting part configured to support the inner tube and having a thickness equal to or greater than the first thickness.

(Supplementary Note 3)

In the substrate processing apparatus of Supplementary Note 1, the reaction tube may include an outer tube and an inner tube, and the protrusion part of the manifold may form a supporting part configured to support the inner tube, wherein the supporting part extends inward more than an inner wall of the inner tube, and a groove is formed in an inner wall of the supporting part from the gas supply unit to a surface on which the inner tube is placed.

(Supplementary Note 4)

In the substrate processing apparatus of Supplementary Note 3, a gas supply nozzle or a temperature sensor may be disposed at the groove.

(Supplementary Note 5)

In the substrate processing apparatus of Supplementary Note 3, the groove may have a depth equal to or greater than a radius of a gas supply nozzle or a temperature sensor.

(Supplementary Note 6)

In the substrate processing apparatus of Supplementary Note 1, a length of the manifold defined from an inner circumferential surface of the reaction tube to an inner diameter of the manifold in the direction perpendicular to the center axis of the reaction tube may be greater than the second thickness.

(Supplementary Note 7)

In the substrate processing apparatus of Supplementary Note 2, a length of the manifold defined from an inner circumferential surface of the outer tube to an inner circumferential surface of the inner tube in the direction perpendicular to the center axis of the reaction tube may be greater than a length of the manifold defined from an inner wall to an outer wall of the outer tube in the direction perpendicular to the center axis of the reaction tube.

(Supplementary Note 8)

In the substrate processing apparatus of Supplementary Note 2, an exhaust pipe may be formed at a sidewall of the outer tube, and the exhaust pipe may include a slope part obliquely extending from a position of the sidewall higher than an outer tube receiving part to a position lower than an upper end of the outer tube receiving part.

(Supplementary Note 9)

The substrate processing apparatus of Supplementary Note 2, may further include: an outer tube receiving part configured to support a lower end part of the outer tube; a manifold receiving part configured to support the manifold; a coupling member configured to couple the outer tube receiving part and the manifold receiving part; and a post configured to support the outer tube receiving part or the manifold receiving part.

(Supplementary Note 10)

In the substrate processing apparatus of Supplementary Note 2, the outer tube, the inner tube, and the manifold may be made of quartz.

(Supplementary Note 11)

According to another preferred embodiment of the present invention, there is provided a substrate processing apparatus including: a process vessel in which a substrate held by a boat is processed; a manifold including a gas supply unit configured to supply gas to an inside of the process vessel; a cover part configured to cover an opening of the manifold and including a circular hole; a rotation mechanism disposed at the cover part outside the process vessel; and a boat receiving part installed at a rotation shaft of the rotation mechanism, wherein the circular hole of the cover part has a diameter greater than an outer diameter of the boat receiving part.

(Supplementary Note 12)

In the substrate processing apparatus of Supplementary Note 11, the boat receiving part may be made of a metal and be disposed at a position lower than a seal cap cover installed at the cover part.

(Supplementary Note 13)

In the substrate processing apparatus of Supplementary Note 12, a pedestal composed of a non-metallic member may be installed between the boat receiving part and the boat.

(Supplementary Note 14)

In the substrate processing apparatus of Supplementary Note 13, the boat may be composed of a non-metallic member, and the pedestal may be made of an alumina containing material.

(Supplementary Note 15)

In the substrate processing apparatus of Supplementary Note 13, the rotation mechanism may be detachable from an outside of the process vessel in a state where the boat is separated and the opening of the manifold is closed by the cover part.

(Supplementary Note 16)

The substrate processing apparatus of Supplementary Note 2 may further include: an outer tube receiving part configured to support a lower end of the outer tube; and a manifold receiving part configured to support a lower end of the manifold.

(Supplementary Note 17)

According to another preferred embodiment of the present invention, there is provided a method of manufacturing a semiconductor device using the substrate processing apparatus of Supplementary note 1, the method including: while loading a substrate into the reaction tube, closing the opening of the manifold using the cover part; while heating an inside of the reaction tube, processing the substrate by supplying gas to the inside of the reaction tube through the gas supply unit installed at the manifold; and while unloading the substrate from the reaction tube, opening the cover part used to close the opening of the manifold.

(Supplementary Note 18)

According to another preferred embodiment of the present invention, there is provided a method of manufacturing a semiconductor device, the method including: loading a substrate held by a cover part into a reaction tube, closing an opening of a non-metallic manifold using the cover part, wherein a first thickness of the manifold defined in a direction perpendicular to a center axis of the reaction tube is greater than a second thickness of the manifold defined at a position adjacent to the reaction tube in a direction parallel to the center axis of the reaction tube, and the manifold includes a protrusion part of which at least a portion protrudes inward more than an inner wall of the reaction tube; heating an inside of the reaction tube, processing the substrate by supplying gas to the inside of the reaction tube through a gas supply unit installed at at least the protrusion part of the manifold; and unloading the substrate from the reaction tube, opening the cover part used to close the opening of the manifold.

What is claimed is:

1. A substrate processing apparatus comprising:
    a reaction tube including an outer tube and an inner tube disposed in the outer tube; and
    a ring-shaped manifold made of a non-metallic material, the ring-shaped manifold including:
    an outer tube supporting part supporting the outer tube;
    a protrusion part disposed interior to the outer tube supporting part and supporting the inner tube; and
    a gas supply unit disposed at the protrusion part, the gas supply unit configured to supply gas into the reaction tube,
    wherein a first length corresponding to a distance between an outer circumferential surface and an inner circumferential surface of the manifold is greater than a second length corresponding to a distance between a top surface of the outer tube supporting part in contact with the outer tube and a bottom surface of the manifold.

2. The substrate processing apparatus of claim 1, wherein a top surface of the protrusion part in contact with the inner tube is higher than the top surface of the outer tube supporting part in contact with the outer tube.

3. The substrate processing apparatus of claim 1,
    wherein a distance between an inner circumferential surface of the outer tube and an inner circumferential surface of the manifold is greater than the second length.

4. The substrate processing apparatus of claim 1,
    wherein the second length is greater than a distance between an inner circumferential surface of the outer tube and the inner circumferential surface of the manifold.

5. The substrate processing apparatus of claim 1, further comprising:
    an exhaust pipe disposed on an outer circumferential surface of the outer tube, the exhaust pipe including a slope portion obliquely extending from the outer circumferential surface of the outer tube to a position lower than a top surface of a protrusion protruding from a top surface of the protrusion part.

6. The substrate processing apparatus of claim 1, further comprising:
an outer tube receiving part mounted on an outer circumference of a flange at a lower end of the outer tube to support the outer tube;
a manifold receiving part supporting the manifold;
a coupling member coupling the outer tube receiving part and the manifold receiving part; and
a post supporting one of the outer tube receiving part and the manifold receiving part.

7. The substrate processing apparatus of claim 1, wherein each of the outer tube, the inner tube and the manifold comprises quartz.

8. The substrate processing apparatus of claim 1, further comprising:
an outer tube receiving part mounted on an outer circumference of a flange at a lower end of the outer tube to support the outer tube; and
a manifold receiving part supporting the manifold.

9. A method of manufacturing a semiconductor device using a substrate processing apparatus of claim 1, the method comprising:
closing an opening of a manifold using a seal cap while loading a substrate into a reaction tube;
processing the substrate by supplying a gas into the reaction tube through a gas supply unit installed at the manifold while heating an inside of the reaction tube; and
opening the seal cap while unloading the substrate from the reaction tube.

10. A substrate processing apparatus comprising:
a reaction tube including an outer tube and an inner tube disposed in the outer tube; and
a ring-shaped manifold made of a non-metallic material, the ring-shaped manifold including:
an outer tube supporting part supporting the reaction tube from under the reaction tube;
a protrusion part disposed interior to the outer tube supporting part; and
a gas supply unit disposed at the protrusion part, the gas supply unit configured to supply gas into the reaction tube,
wherein a first length corresponding to a distance between an outer circumferential surface and an inner circumferential surface of the manifold is greater than a second length corresponding to a thickness of the outer tube supporting part, and
wherein the protrusion part comprises a groove in an inner wall of the protrusion part, the groove extending from the gas supply unit to a contacting surface between the protrusion part and the inner tube.

11. The substrate processing apparatus of claim 10, further comprising:
one of a gas supply nozzle and a temperature sensor disposed in the groove.

12. The substrate processing apparatus of claim 11, wherein a depth of the groove is greater than a radius of one of the gas supply nozzle and the temperature sensor.

13. The substrate processing apparatus of claim 10, further comprising:
a seal cap installed under the manifold and comprising a circular hole;
a boat receiving part installed in the circular hole and supporting a boat accommodated in the inner tube; and
a rotation mechanism disposed lower than the seal cap and comprising a rotation shaft capable of rotating with the boat receiving part, the rotation shaft supporting the boat receiving part from under the boat receiving part,
wherein a diameter of the circular hole is greater than an outer diameter of the boat receiving part.

14. The substrate processing apparatus of claim 13, further comprising:
a seal cap cover covering the seal cap from thereon,
wherein the boat receiving part made of metal is disposed at a position lower than the seal cap cover.

15. The substrate processing apparatus of claim 14, further comprising:
a pedestal of a non-metallic material installed between the boat receiving part and the boat.

16. The substrate processing apparatus of claim 15, wherein the boat comprises a non-metallic material.

17. The substrate processing apparatus of claim 16, wherein the pedestal comprises an alumina-containing material.

18. The substrate processing apparatus of claim 15, wherein the rotation mechanism is detachable with the seal cap installed under the manifold.

19. A method of manufacturing a semiconductor device performed in a substrate processing apparatus, the substrate processing apparatus comprising: a reaction tube including an outer tube, and an inner tube disposed in the outer tube; and a ring-shaped manifold made of a non-metallic material, the ring-shaped manifold including an outer tube supporting part supporting the outer tube, a protrusion part disposed interior to the outer tube supporting part and supporting the inner tube and a gas supply unit disposed at the protrusion part, the gas supply unit being configured to supply gas into the reaction tube, wherein a first length corresponding to a distance between outer and inner circumferential surfaces of the manifold is greater than a second length corresponding to a distance between a top surface of the outer tube supporting part in contact with the outer tube and a bottom surface of the manifold, the method comprising:
closing an opening of the manifold using a seal cap while loading a substrate into the reaction tube;
processing the substrate by supplying the gas into the reaction tube through the gas supply unit while heating the inside of the reaction tube; and
opening the seal cap while unloading the substrate from the reaction tube.

* * * * *